United States Patent
Tsai et al.

(10) Patent No.: US 7,242,650 B2
(45) Date of Patent: Jul. 10, 2007

(54) APPARATUS AND METHOD FOR RECOVERING CLOCK SIGNAL EXTRACTED FROM PRERECORDED INFORMATION IN OPTICAL STORAGE DEVICES

(75) Inventors: Chao-Long Tsai, Hsinchu (TW); Jin-Bin Yang, Changhua (TW)

(73) Assignee: Mediatek Incorporation, Hsin-Chu (TW)

( * ) Notice: Subject to any disclaimer, the term of this patent is extended or adjusted under 35 U.S.C. 154(b) by 438 days.

(21) Appl. No.: 10/351,195

(22) Filed: Jan. 23, 2003

(65) Prior Publication Data
US 2004/0145982 A1 Jul. 29, 2004

(51) Int. Cl.
*G11B 7/005* (2006.01)
(52) U.S. Cl. .................. 369/47.28; 369/53.34
(58) Field of Classification Search ........... 369/47.28, 369/47.22
See application file for complete search history.

(56) References Cited

U.S. PATENT DOCUMENTS 5,663,945 A * 9/1997 Hayashi et al. .......... 369/47.28
6,901,039 B1 * 5/2005 Sugie et al. ............ 369/47.28
7,016,284 B2 * 3/2006 Chou .................. 369/53.34
2002/0003764 A1 * 1/2002 Osada ................. 369/53.34
2003/0169656 A1 * 9/2003 Chou et al. ............ 369/47.28
2004/0037185 A1 * 2/2004 Tawaragi .............. 369/47.28

* cited by examiner

Primary Examiner—Wayne Young
Assistant Examiner—Nathan Danielsen
(74) Attorney, Agent, or Firm—Winston Hsu

(57) ABSTRACT

The invention advantageously provides an apparatus and method for recovering clock signals extracted from prerecorded wobbled grooves formed in an optical storage medium such as a compact disk (CD), mini disk (MD) or digital video disk (DVD). A preferred embodiment of the method according to the invention primarily comprises the steps of extracting a series of wobble signals from the prerecorded information, demodulating the wobble signals for generating a series of demodulated clock signals, detecting a period for the clock signals, dividing each of the clock signals for acquiring a series of synchronization frames, generating compensating phases, and respectively adjusting the synchronization frames with the compensating phases for generating a series of phase compensated frames.

15 Claims, 4 Drawing Sheets

APPARATUS AND METHOD FOR RECOVERING CLOCK SIGNAL EXTRACTED FROM PRERECORDED INFORMATION IN OPTICAL STORAGE DEVICES

FIELD OF THE INVENTION

The present patent application generally relates to optical storage and, more particularly, to an apparatus and method for recovering and processing clock signals extracted from prerecorded information in optical disks or storage devices.

DESCRIPTION OF THE RELATED ART

A recordable compact disk (CD-R) system uses an optical disk in the art to record synchronization, clock and address information as wobble signals when controlling the rotation of the optical disk by forming wobbling or meandering grooves on the CD-R. The wobbling or meandering grooves provide means for data tracking when writing or reading data.

The wobbled grooves, which are frequency modulated signals detected and processed in the CD-R system, generally comprise addressing and other information that are necessary for write and read processes in the CD. The wobble signal is a signal that is frequency shift keying (FSK) modulated by a modulation signal of a bi-phase code (or "BIDATA") including address information with respect to a plurality of addresses recorded on an optical disk. When the optical disk is rotated at a specified linear velocity, a wobble binary line (WBL) frequency (or fwbl) is set at 22.05±0.1 KHz. The wobble signals are binarized in generating the WBL signal where an edge interval of the obtained WBL signal is measured for performing on FSK demodulation. The absolute time in pregroove (ATIP) signal includes a synchronization signal, i.e., address information, error detection code and addresses themselves. An exemplary frequency for the synchronization signal is set at 75 Hz.

In a typical CD system in the related art, a wobble signal from a terminal is supplied to a phase comparator, where the wobble signal is subjected to a phase comparison with an output signal of a voltage control oscillator (or VCO). The phase error signal obtained by the phase comparator is supplied to a low pass filter (LPF) for filtering out unneeded high-frequency components. The filtered phase error signal is output from a terminal as an FSK demodulated signal, which is supplied to a multiplier. The FSK demodulated signal is multiplied by a loop gain by the multiplier, and the result is then supplied to the VCO.

In analog circuitry, when an entire circuit is integrated into a single semiconductor device, it is difficult to accurately set circuit element constants. Thus, circuit elements that require a certain level of precision must be externally mounted, resulting in circuit integration issues.

In addition, a digital circuit such as a phase lock loop (or PLL) may be used to enable circuit integration, where a wobble signal is binarized for generating a WBL signal. An edge interval of the obtained WBL signal is measured to perform an FSK demodulation. The quality of the wobble signal may be adversely affected by the quality of a circuit element. In particular, if noise affecting the phase of the wobble signal enters the circuit, the quality of the FSK demodulated signal is consequently deteriorated. Moreover, there is an increased likelihood of noise in the detected signals, which will cause synchronization marks stamped on the optical disk to either fail to be detected or to be falsely detected.

When a signal-to-noise (S/N) ratio of the wobble signal is decreased or if there is a defect in the optical disk, the position of the edge of the modulation signal BIDATA is affected and subsequently fluctuates. An error is therefore likely generated in the ATIP data, which is latched by the signal edges of the digital circuit (such as a PLL clock). The quality of the ATIP data is consequently deteriorated.

There is thus a general need in the art for an optimal apparatus and method for recovering and processing clock signals extracted from prerecorded information in optical storage media, which advantageously overcomes at least the aforementioned shortcomings in the art. In particular, there is a need in the art for an efficient and optimal apparatus and method for detecting and processing synchronization marks and address information prerecorded in an optical disk to efficiently control the operation of a high-speed writer and reader of optical storage media. There is a further need in the art for an optimal apparatus and method for writing and reading optical storage media with generally uninterrupted clock signals free of invalid or missing synchronization pulses.

SUMMARY OF THE INVENTION

The invention advantageously provides an apparatus and method for recovering clock signals extracted from prerecorded wobbled grooves formed in an optical storage medium such as a compact disk (CD), mini disk (MD) or digital video disk (DVD). In particular, the invention advantageously provides an apparatus and method for recovering clock signals extracted from prerecorded wobbled grooves formed in optical storage media such as a compact disk. A preferred embodiment of the method according to the invention primarily comprises the steps of extracting a series of wobble signals from the prerecorded information, slicing the wobble signals, demodulating the wobble signals for generating a series of demodulated clock signals, detecting a period for the clock signals, dividing each of the clock signals for acquiring a series of synchronization frames, generating compensating phases, and respectively adjusting the synchronization frames with the compensating phases for generating a series of phase compensated frames.

The apparatus according to a preferred embodiment of the invention primarily comprises an ATIP sync recovery circuit that receives a series of wobble signals from a reader or writer of an optical storage medium such as a compact disk. The ATIP sync recovery circuit demodulates the wobble signals in generating a series of demodulated ATIP sync signals. A clock period calculator/estimator receives the ATIP sync signals from the ATIP sync recovery circuit. A first reference clock detects the period of the ATIP sync signals and divides each of the ATIP sync signals. The clock period calculator/estimator outputs a series of ATIP sync frames, each covering a plurality of clocks. A compensating phase generator receives the ATIP sync signals (from the ATIP sync recovery circuit), the reference clock, and a feedback signal. An adder receives the ATIP sync frames from the clock period calculator/estimator and the compensating phases from the compensating phase generator for adjusting the ATIP Sync frames with the compensating phases, where the adder outputs a series of phase compensated frames. A clock generating circuit receives the phase compensated frames from the adder and a second reference clock for generating an output clock and a feedback clock based on the second reference clock.

The apparatus and method according to the invention advantageously and optimally recover and process clock signals extracted from prerecorded information of optical storage media, which advantageously overcomes at least the aforementioned shortcomings in the art. In particular, the apparatus and method according to the invention efficiently and optimally detect and process synchronization marks and address information prerecorded in an optical disk to thereby efficiently control the operation of a high-speed writer and reader of optical storage media. Moreover, the apparatus and method according to the invention optimally write and read optical storage media with generally uninterrupted clock signals free of invalid or missing synchronization pulses.

BRIEF DESCRIPTION OF THE DRAWINGS

The foregoing features and advantages of the invention will become more apparent in the following Detailed Description when read in conjunction with the accompanying drawings (not necessarily drawn to scale), in which.

DETAILED DESCRIPTION OF PREFERRED EMBODIMENTS

The details of the invention will be described hereinafter in conjunction with the appended drawings. Those ordinarily skilled in the art should understand that the following includes exemplary descriptions of the invention. Modifications and variations within the scope and spirit of the invention are also covered as defined by the appended claims and their equivalents.

Figure 1:
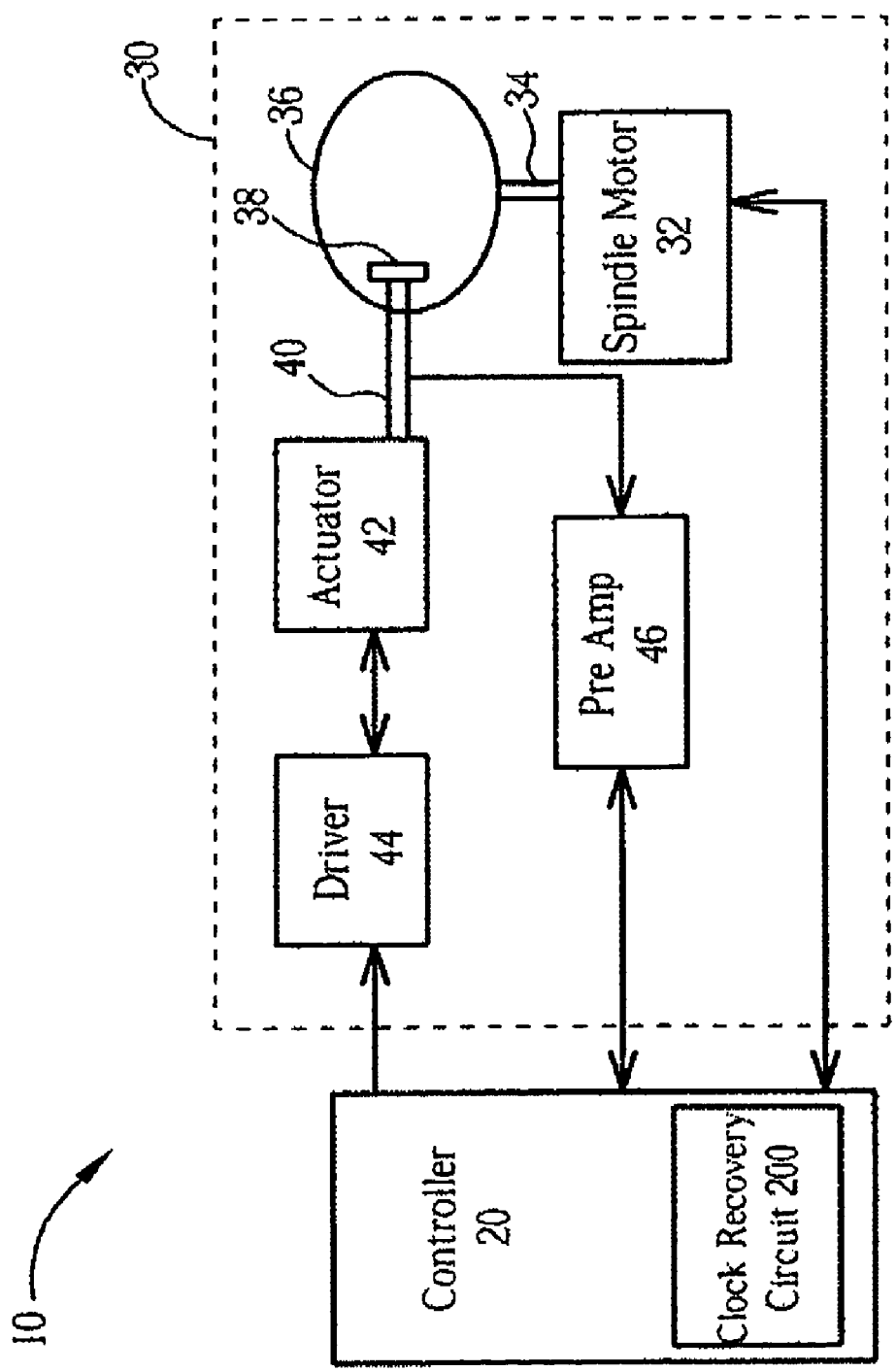
FIG. 1 is a schematic view generally illustrating an optical disk system according to the invention.

FIG. 1 is a schematic view that generally illustrates an optical system 10 according to the invention. The optical disk system 10 includes a controller 20 that connects to a disk drive such as an optical disk drive 30. The optical disk drive 30 can be a digital video disk (DVD), compact disk (CD), DVD-ROM (digital video disk read only memory), DVD-RW (digital video disk read write), DVD+RW (digital video disk rewritable), DVD-RAM (digital video disk random access memory), CD-R (compact disk recordable) or CD-RW (compact disk rewritable). The optical system 10 can also serve as a storage medium in a personal computer (PC), workstation, notebook computer, palmtop computer, personal digital assistant (PDA), wireless computer or any equipment that needs it. In the optical disk drive 30, a spindle motor 32 is connected to a spindle 34 that supports at least one optical disk 36. In response to control signals from the controller 20, the spindle motor 32 rotates the spindle 34 and thus the disk 36. As the disk 36 rotates, an optical head 38 reads information from or writes information to the disk 36. The optical head 38 is supported by an actuator arm 40, which is connected to an actuator 42. A motor driver 44 is connected to the actuator 42 to move it to position the head 38 with respect to a target track for reading or writing information on the disk 36. A preamplifier 46 receives an analog signal from the head 38 and outputs it, along with other signals, to the controller 20 where a clock recovery circuit 200 therein efficiently and optimally detects and processes synchronization marks and address information prerecorded on the optical disk 36. The clock recovery circuit 200 according to the invention optimally and efficiently controls the high-speed operation of writing and reading data of the optical storage media 36. Moreover, data is optimally read from and written to the optical storage media 36 according to the invention with generally uninterrupted clock signals advantageously free of invalid or missing synchronization pulses.

Figure 3:
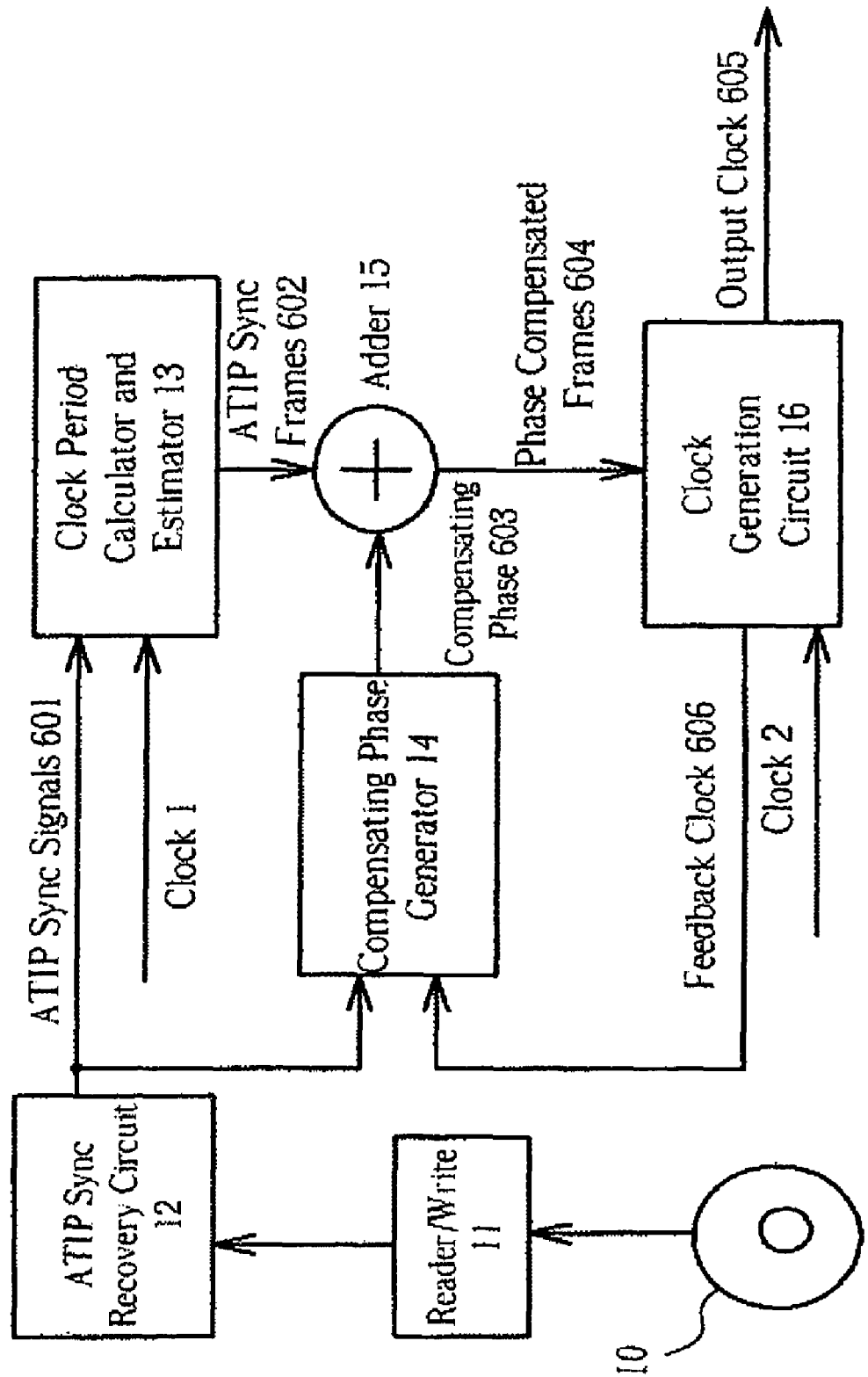
FIG. 3 is a block diagram generally illustrating the structure of an apparatus for recovering clock signals in optical storage media according to a general embodiment of the invention.
Figure 4:
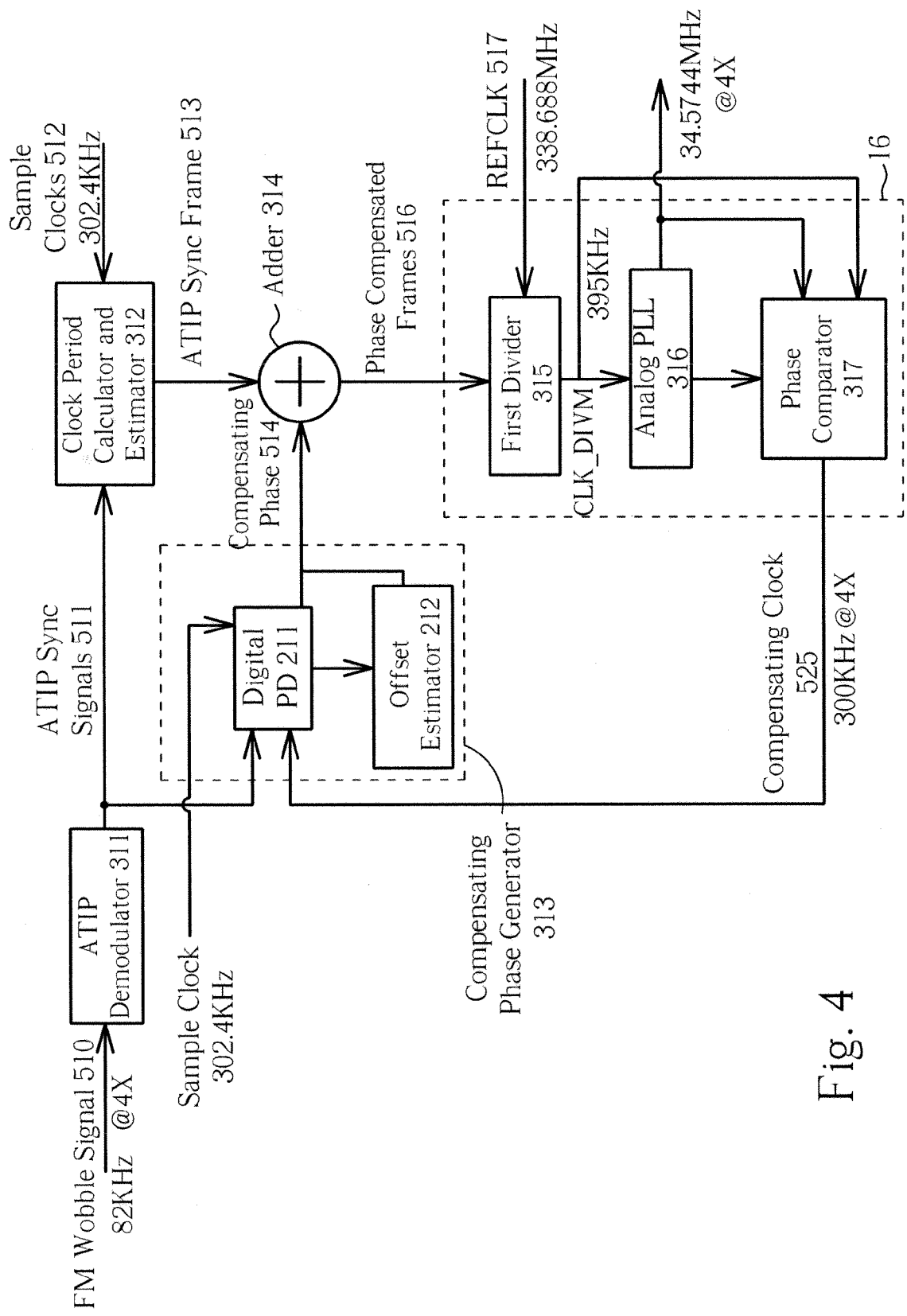
FIG. 4 is a block diagram illustrating the structure of an apparatus for recovering clock signals in optical storage media according to a preferred embodiment of the invention.

As shown in FIG. 3 and FIG. 4 and described in more detail later, a preferred embodiment of the invention advantageously provides an apparatus for recovering clock signals extracted from prerecorded information of an optical storage medium. The apparatus according to this preferred embodiment of the invention comprises a clock recovery circuit 200 receiving a series of wobble signals from a reader/writer 11 in the optical storage device, slicing and demodulating the wobble signals for generating a series of demodulated clock signals; a clock period estimator 13 receiving the clock signals from the clock recovery circuit 200 and a first reference clock for detecting a period of the clock signals and dividing each of the clock signals by the first reference clock, wherein the first clock period calculator and estimator 13 outputs a series of synchronization frames, each covering a plurality of clocks; a compensating phase generator 14 receiving the clock signals from the clock recovery circuit 200, the reference clock and a feedback signal for generating and outputting a compensating phase; an adder 15 receiving the synchronization frames from the clock period calculator and estimator 312 and the compensating phases from the compensating phase generator 313 for respectively adjusting the synchronization frames with the compensating phase, the adder 314 outputting a series of phase compensated frames; and a clock generating circuit 200 receiving the phase compensated frames from the adder 314 and a second reference clock for generating an output clock and a feedback clock based on the second reference clock. The prerecorded information can further comprise prerecorded wobbled grooves formed on the optical storage medium 36, where the clock signals further comprise absolute time in pregroove (ATIP) signals.

Another embodiment of the clock recovery circuit 200 according to the invention further comprises a demodulator 311 for demodulating the wobble signals 510. Another embodiment about the compensating phase generator 313 according to the invention further comprises a digital phase detector 211 receiving the sync signals 511 from the demodulator 311 for respectively determining a phase of the sync signals 511, and an offset estimator 212 receiving a feedback signal comprising a phase lock compensating phase and a feedback phase of a previous signal in the plurality of clock signals. Another embodiment of the clock generating circuit 16 according to the invention further comprises a first divider 315 receiving the phase compensated frames from the adder 314 and the second reference clock for further dividing the phase compensated frames by the second reference clock, the first divider 315 outputting divided compensated frames, an analog phase lock loop (PLL) 316 receiving the divided compensated frames and providing a multiplication factor for multiplying the divided compensated frames for outputting an optical head operating frequency, and a phase comparator 317 for comparing a phase of the optical head operating frequency and the divided compensated frames for outputting a compensating clock to the compensating phase generator 313. Further according to the invention, the multiplication factor and the second reference clock are selected so that the optical head operating frequency generally equals the multiplication factor multiplied by the second reference clock.

Figure 2:
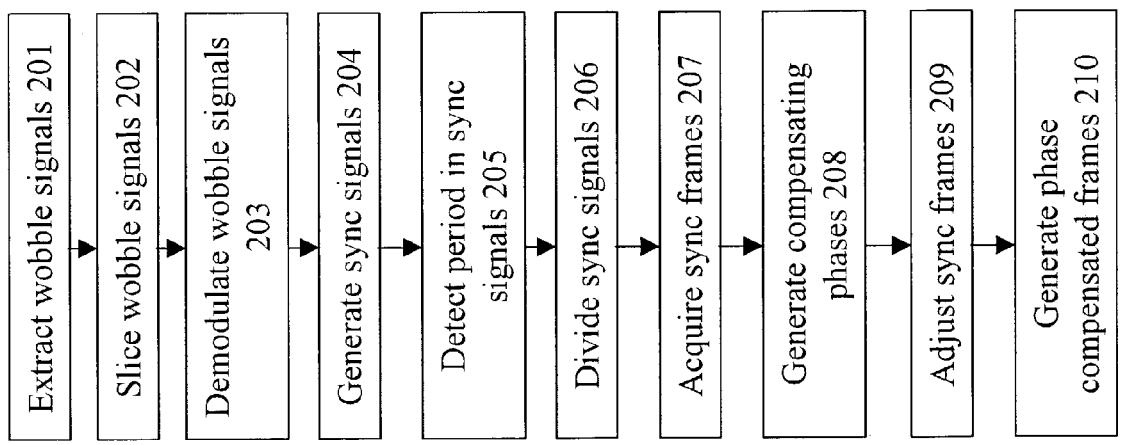
FIG. 2 is a flow diagram generally illustrating the process steps of a method for recovering clock signals in optical storage media according to a general embodiment of the invention.

FIG. 2 is a flow diagram that generally illustrates the process steps of a method for recovering clock signals of optical storage media according to a general embodiment of the invention. The invention advantageously provides an apparatus and method for recovering clock signals extracted from prerecorded wobbled grooves formed on an optical storage medium 36 such as a compact disk (CD), mini disk (MD) or digital video disk (DVD). In particular, the invention advantageously provides an apparatus and method for recovering clock signals extracted from prerecorded wobbled grooves formed on optical storage media such 36 as a compact disk. A preferred embodiment of the method according to the invention primarily comprises the steps of extracting a series of wobble signals from the prerecorded information (step 201), slicing the wobble signals (step 202), demodulating the wobble signals (step 203) for generating a series of demodulated clock signals (step 204), detecting a period of the clock signals (step 205), dividing each of the clock signals (step 206) for acquiring a series of synchronization frames (step 207), generating compensating phases (step 208), and respectively adjusting the synchronization frames with the compensating phases (step 209) for generating a series of phase compensated frames (step 210). The prerecorded information can further comprise prerecorded wobbled grooves formed on the optical storage medium 36.

The method according to another embodiment of the invention further comprises the steps of dividing each of the clock signals with a first reference clock, and generating an output clock and a feedback clock in response to a second reference clock. The method according to yet another embodiment of the invention further comprises the steps of determining a phase for each of the clock signals, receiving feedback signals comprising a phase lock compensating phase and a feedback phase of a previous clock signal in the series of clock signals, determining an average phase of a plurality of incoming clock signals, and comparing the average phase with the phase for each of the clock signals for respectively deriving a phase difference for generating the compensating phases. Moreover, the method according to yet another embodiment of the invention further comprises the steps of dividing the phase compensated frames by the second reference clock, and multiplying the divided phase compensated frames for acquiring an optical head operating frequency in the optical storage medium. The method according to the invention can further comprise the step of multiplying a frequency of the divided phase compensated frames with a phase determined based on the divided phase compensated frames in acquiring the optical head operating frequency.

FIG. 3 is a block diagram that generally illustrates the structure of an apparatus for recovering clock signals of an optical storage media 10 according to a general embodiment of the invention. In FIG. 3, the reader/writer 11 includes an optical head (not shown) that processes light signals reflected from the optical disk 10 or writes optical data onto the disk 10, preferably in the middle of the wobbled grooves. The pregrooves may not be perfect signals but are generally wobbled with an exemplary amplitude of 30 nanometers (nm) and spatial period of 54 to 64 millimeters (mm). The spiraled, wobbled pregrooves comprise ATIP (Absolute Time in Pregroove) information, such as address information and other information that is necessary for the write and read processes of the CD writer/reader 11. The ATIP information is encoded in blocks of 42 bits, including 4 bits of synchronization marks, 24 bits of address information (including 8 bits of minutes, 8 bits of seconds, and 8 bits of frames), and 14 bits of error detection code such as cyclic redundancy check (CRC) code. The ATIP signals are generally bi-phase and frequency modulated, and are then written onto the optical storage media 10.

In general, the optical disk 10 is rotated by a spindle motor (not shown). As optical pickup (not shown) reproduces a wobble signal from the optical disk 10. The reader/writer 11 reads the wobble signals from the optical disk 10, where the wobble signals are sent to an ATIP sync recovery circuit 12. The ATIP sync recovery circuit 12 demodulates the wobble signals for generating a series of demodulated ATIP sync signals 601. The ATIP sync signals 601 are outputted to a clock period calculator/estimator 13. The clock period calculator/estimator 13 further receives a reference clock 1 for detecting the period of the ATIP sync signals 601 and dividing each of the ATIP sync signals 601 by the reference clock 1. The clock period calculator/estimator 13 outputs a series of ATIP sync frames 602 to an adder 15. Each frame 602 is an ATIP sync signal covering a plurality of clocks. A compensating phase generator 14 receives the ATIP sync signals 601 (from the ATIP sync recovery circuit 12), the reference clock 1 and a feedback clock signal 606. The compensating phase generator 14 outputs compensating phases 603 to the adder 15. The adder 15 receives the ATIP sync frames 602 from the clock period calculator/estimator 13 and the compensating phases 603 from the compensating phase generator 14 for adjusting the ATIP sync frames 602 with the compensating phases 603. The adder 15 outputs a series of phase compensated frames 604. The clock generating circuit 16 receives the phase compensated frames 604 from the adder 15 and a second clock 2 for generating an output clock 605 and the feedback clock 606 based on the second reference clock 2.

FIG. 4 is a block diagram that illustrates the structure of an apparatus for recovering clock signals of an optical storage media according to another preferred embodiment of the invention. For an apparatus according to the invention supporting 4× ("four times") CD read/write, the modulating frequency for frequency modulation (FM) is generally 88.2 kilo Hertz (kHz) and the frequency for the ATIP synchronization is generally 300 Hertz (Hz). The FM wobble signals 510 (88.2 kHz at 4×) are input to the ATIP demodulator 311 for removing the modulated FM signals having a frequency of generally 88.2 kHz (22.05 kHz at 4×). The ATIP demodulator 311 then outputs a series of ATIP sync signals 511 and data signals, where the data signals are filtered. The ATIP sync signals 511 serve to determine the phase, period and timing of the wobble signals 510 so that the reader/writer can exactly trace the wobble signals 500 on the optical storage medium. The ATIP sync signals 511 are generally bi-phase signals with a frequency of generally 300 Hz @4× (75 Hz×4). The outputted ATIP sync signals 511 are further input to a clock period calculator/estimator 312 and a compensating phase generator 313.

The clock period calculator/estimator 312 receives the ATIP sync signals 511 from the ATIP demodulator 311 and sample clock signals 512 with a frequency of generally 302.4 kHz. The sample clock signals 512 serves to count and phase-add the ATIP sync signals 511 in the click period calculator/estimator 312 for generating a series of ATIP sync frames 513 with a frame period of 1008 (or 302.4 KHz/300 Hz, where each of the ATIP sync frames 513 covers 1008 clocks), totaling 300 frames per second.

The ATIP sync frames 513 generated in the clock period calculator/estimator 312 are transferred to an adder 314 in a sequential fashion. In the meantime, a compensating phase 514 outputted from the compensating phase generator 313 is inputted to the adder 314 for adjusting the ATIP sync frames 513 from the clock period calculator/estimator 312. A series of phase compensated frames 516 are generated and outputted from the adder 313, which are then inputted to a first divider 315. In the first divider 315, a reference clock 517 with a frequency of 338.688 mega Hertz (MHz) is inputted to the divider 315 for dividing the phase compensated frames 516 from the adder 313. After adding the reference clock 517, each of the compensated frames 516 includes a frequency of generally 1.12 kHz (or 338.688/(1008×300)) plus or minus the compensated frequency. The dividing frames CLK_DIVM are outputted to an analog phase lock loop (analog PLL) 316. The analog phase lock loop 316 multiplies the input dividing frames CLK_DIVM by a factor. That is, each dividing frame CLK_DIVM outputted from the first divider 315 is multiplied by a factor for acquiring a desired output frequency. For example, @3× CR-RW, the desired output is generally 34.5744 MHz which is the designed frequency for reading and writing data therein. The multiplication factor of the analog PLL 316 is accordingly selected as approximately 102.9 (or 34.5744 MHz/336 kHz). An offset estimator 212 can also be included in compensating for frequency offsets. The analog PLL 316 outputs the desired frequency to a reader/writer and a phase comparator 317.

In operating the phase comparator 317, if the multiplication factor is N, which is generally 103, then the output of the analog PLL 316 is generally 34.5744 MHz. However, if the output frame frequency of the clock period calculator/estimator 312 is not compensated, then the output from the analog PLL 316 is 336 kHz×103, or 34.608 MHz. This output frequency from the analog PLL 316 does not exactly match the operating frequency of 34.5744 MHz required in a @4× CD-RW with a deviation of 0.0336 MHz. For each ATIP sync signal 511, there is a deviation of 0.0336 MHz/300, or 112 clocks. If the operating frequency for the analog PLL 316 is selected as 103, then the output frame frequency from the clock period calculator/estimator 312 is to be compensated with a compensated clock value of 1.08737, i.e., 112 clocks/103 per ATIP sync signal 511. The phase comparator 317 outputs a compensating clock 525, which is then fed back to the compensating phase generator 313.

The compensating phase generator 313 receives the compensating clock 525 as the offset for being fed to the adder 314 as the compensating phase 514. In accounting for noise in the ATIP sync signals 511, when the signal to noise (S/N) ratio of the wobble signals 510 is decreased or if there is a defect on the optical disk, the position of the signal edges of the ATIP sync signals 511 is affected and thus fluctuates. In such a case, an error may result in the ATIP data, which is latched by the signal edges of the clock signal outputted by the analog PLL 316. An error detection code (e.g., CRC code provided in the ATIP data) can detect such an error. A sync detect signal is an unprocessed signal, where errors such as false sync detect signals resulting from noise or misplaced signal edges may occur. Sync mark signals may not be detected for similar reasons. To increase reliability and ATIP channel robustness, the noise effect is adjusted by a feedback mechanism. For noise reduction in the clock recovery of ATIP sync signals 511 from the CD-RW, the ATIP sync signals 511 output from the ATIP demodulator 311 are transferred to the compensating phase generator 313. The compensating phase generator 313 includes a digital phase detector 211 and an offset estimator 212. The offset estimator 212 receives the compensating clock 525 from the phase comparator 317. The compensating clock 525 is fed to the adder 314 in subtraction of the ATIP sync frames 513 outputted from the clock period calculator/estimator 312. The digital phase detector 211 receives the ATIP sync signals 511 from the ATIP demodulator 311 and a sample clock 550 of 302.4 kHz. If the input wobble signals 510 are purely signals without noise, then each frame of ATIP sync signals 511 covers a range of 1008 clocks, generally aligning the ATIP sync signals 511. If noise or misplaced data edges are present, inducing phase errors in the input ATIP sync signals 511 where the signal edges of one ATIP sync signal 511 is erroneously shifted. A correction is then needed so that the read/write head can respectively read and write data of the optical storage medium with correct timing and phase. The feedback of the previous ATIP sync signal 511 edge is fed back from the analog PLL 316 to the digital phase detector 211 via the phase comparator 317. If this feedback ATIP sync signal (i.e., the compensating clock 525) carries noise, where the noise average is zero, as a plurality of detected values are averaged, such an average will approach a correct signal value. A plurality of reference ATIP syncs signals is time-averaged to acquire an average signal edge as a reference ATIP sync signal. The signal edges of current ATIP sync signals 511 are compared with the signal edges of reference ATIP sync signals for deriving a reference phase deviation. The phase deviation is then input to the adder 314 for correcting the phase of the ATIP sync frames 513 outputted from the clock period calculator/estimator 312. The compensating phase generator 313 generates two terms, including one for correcting errors due to the multiplication factor of the analog PLL 316, and another for correcting errors due to noise or misreading of the signal edges of the ATIP sync signals 511.

The invention, which has been described in detail in the foregoing description, is particularly advantageous in that it provides the capability to process and detect the ATIP synchronization marks at a 4× CD rate. The circuitry also provides means to eliminate false sync detection by using a feedback mechanism in the phase lock loop. The circuitry of the invention provides means to generate an uninterrupted sync signal from an actual sync mark detection. It would be apparent to one skilled in the art that the invention can be embodied in various ways and implemented in many variations. For instance, an optical storage medium of compact disks is described herein in illustrating various embodiments of the invention. The invention is accordingly applicable in this and other types of optical storage media, such as a video compact disk (VCD), mini disk (MD) or digital video disk (DVD). Such and other variations are not to be regarded as a departure from the spirit and scope of the invention. In particular, the process steps of the method according to the invention will include methods having substantially the same process steps as the method of the invention to achieve substantially the same results. Substitutions and modifications have been suggested in the foregoing Detailed Description, and others will occur to one of ordinary skill in the art. All such modifications as would be obvious to one skilled in the art are intended to be included within the scope of the following claims and their equivalents.

We claim:

1. A method for recovering clock signals extracted from prerecorded information in an optical storage medium, the method comprising the steps of:

extracting a series of wobble signals from said prerecorded information;

demodulating said wobble signals for generating a series of demodulated clock signals;

detecting a period for said demodulated clock signals;

averaging the period of each of said demodulated clock signals for acquiring a series of synchronization frames;
generating compensating phases;
respectively adjusting said synchronization frames with said compensating phases for generating a series of phase compensated frames;
comparing feedback signals with said demodulated clock signals for respectively deriving a phase difference;
generating an average phase difference from said phase difference; and
generating said compensating phases by the combination of said phase difference and said average phase difference.

2. The method of claim 1, wherein said prerecorded information further comprising comprises prerecorded wobbled grooves formed in said optical storage medium.

3. The method of claim 1 further comprising the steps of:
detecting the period for said demodulated clock signals by using a first reference clock; and
generating an output clock and a feedback clock based on a second reference clock.

4. The method of claim 3 further comprising the steps of:
dividing a frequency of said phase compensated frames according to said second reference clock to thereby produce divided phase compensated frames; and
multiplying a frequency of said divided phase compensated frames by a multiplication factor for acquiring an optical head operating frequency.

5. The method of claim 4 further comprising the step of multiplying the frequency of said divided phase compensated frames with a phase determined based on said divided phase compensated frames in acquiring said optical head operating frequency.

6. The method of claim 1, wherein said demodulated clock signals further comprise an error detection code.

7. The method of claim 1, wherein said optical storage medium further comprises one of a digital video disk (DVD), compact disk (CD), DVD-ROM (digital video read only memory), DVD-RW (digital video disk read write), DVD+RW (digital video disk rewritable), DVD-RAM (digital video disk random access memory), CD-R (compact disk recordable), CD-RW (compact disk rewritable) or optical storage medium having wobble signals for clock, synchronization mark and address information.

8. An apparatus for recovering clock signals extracted from prerecorded information in an optical storage medium, the apparatus comprising:
a clock recovery circuit for extracting a series of wobble signals from said prerecorded information and demodulating said wobble signals for generating a series of demodulated clock signals;
a clock period detector circuit for detecting a period for said demodulated clock signals and averaging the period of each of said demodulated clock signals for acquiring a series of synchronization frames;
a compensating phase generator for generating compensating phases;
a clock generating circuit for respectively adjusting said synchronization frames with said compensating phases for generating a series of phase compensated frames;
a phase detector for determining a phase difference between said demodulated clock signals and a feedback clock;
an offset determining circuit for receiving said phase difference, and determining an average phase difference; and a compensating phase generator for generating said compensating phases by the combination of said phase difference and said average phase difference.

9. The apparatus of claim 8, wherein said prerecorded information further comprises prerecorded wobbled grooves formed in said optical storage medium.

10. The apparatus of claim 8 further comprising a first divider for detecting the period for said demodulated clock signals by using a first reference clock, and generating an output clock and a feedback clock based on a second reference clock.

11. The apparatus of claim 8 further comprising:
a divider for dividing a frequency of said phase compensated frames according to said second reference clock to thereby produce divided phase compensated frames; and
a phase locked loop for multiplying a frequency of said divided phase compensated frames by a multiplication factor for acquiring an optical head operating frequency.

12. The apparatus of claim 11 wherein the phase locked loop is further for multiplying the frequency of said divided phase compensated frames with a phase determined based on said divided phase compensated frames in acquiring said optical head operating frequency.

13. The apparatus of claim 8, wherein said demodulated clock signals further comprise an error detection code.

14. The apparatus of claim 8, wherein said optical storage medium further comprises one of a digital video disk (DVD), compact disk (CD), DVD-ROM (digital video disk read only memory), DVD-RW (digital video disk read write), DVD+RW (digital video disk rewritable), DVD-RAM (digital video disk random access memory), CD-R (compact disk recordable), CD-RW (compact disk rewritable) or optical storage medium having wobble signals for clock, synchronization mark and address information.

15. A method for recovering clock signals extracted from prerecorded information in an optical storage medium, the method comprising the steps of:
extracting a series of wobble signals from said prerecorded information;
demodulating said wobble signals for generating a series of demodulated clock signals;
detecting a period for said demodulated clock signals;
averaging the period of each of said demodulated clock signals for acquiring a series of synchronization frames;
generating compensating phases;
respectively adjusting said synchronization frames with said compensating phases for generating a series of phase compensated frames;
detecting the period for said demodulated clock signals by using a first reference clock;
generating an output clock and a feedback clock based on a second reference clock;
dividing a frequency of said phase compensated frames according to said second reference clock to thereby produce divided phase compensated frames; and
multiplying a frequency of said divided phase compensated frames by a multiplication factor for acquiring an optical head operating frequency.

* * * * *